United States Patent
Lerner

(10) Patent No.: US 7,989,921 B2
(45) Date of Patent: Aug. 2, 2011

(54) SOI VERTICAL BIPOLAR POWER COMPONENT

(75) Inventor: Ralf Lerner, Erfurt (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 588 days.

(21) Appl. No.: 11/629,022

(22) PCT Filed: Jun. 10, 2005

(86) PCT No.: PCT/DE2005/001036
§ 371 (c)(1),
(2), (4) Date: Jul. 23, 2008

(87) PCT Pub. No.: WO2005/122271
PCT Pub. Date: Dec. 22, 2005

(65) Prior Publication Data
US 2008/0290366 A1    Nov. 27, 2008

(30) Foreign Application Priority Data
Jun. 11, 2004 (DE) .................. 10 2004 028 474

(51) Int. Cl.
H01L 31/11 (2006.01)
H01L 27/082 (2006.01)
H01L 27/102 (2006.01)
H01L 29/70 (2006.01)

(52) U.S. Cl. ........ 257/565; 257/575; 257/577; 257/579; 257/594; 257/E29.027; 438/205; 438/313; 438/340

(58) Field of Classification Search .............. 257/565, 257/575, 577, 579, 586, 587, 591, 594, 622, 257/E29.027, E29.189, E29.198; 438/205, 438/313, 340
See application file for complete search history.

(56) References Cited

U.S. PATENT DOCUMENTS

| 5,378,920 | A | 1/1995 | Nakagawa et al. | |
| 6,191,456 | B1 * | 2/2001 | Stoisiek et al. | 257/368 |
| 6,259,123 | B1 | 7/2001 | Kelberlau et al. | |
| 2008/0164561 | A1 * | 7/2008 | Krishnan | 257/506 |
| 2008/0258172 | A1 * | 10/2008 | Takahashi et al. | 257/139 |

FOREIGN PATENT DOCUMENTS

| DE | 198 28 669 A1 | 1/2000 |
| EP | 0338 312 A2 | 10/1989 |
| EP | 0 721 211 A2 | 7/1996 |

OTHER PUBLICATIONS

B. Jayant Baliga; Power Semiconductor Devices; 1995; pp. 178-181; Chapter 4: Power Rectifiers; PWS Publishing Company; Boston, MA; USA.

* cited by examiner

*Primary Examiner* — Cuong Q Nguyen
*Assistant Examiner* — Cathy N Lam
(74) *Attorney, Agent, or Firm* — Stevens & Showalter LLP

(57) ABSTRACT

An SOI device comprises an isolation trench defining a vertical drift zone, a buried insulating layer to which the isolation trench extends, and an electrode region for emitting charge carriers that is formed adjacent to the insulating layer and that is in contact with the drift zone. The electrode region comprises first strip-shaped portions having a first type of doping and second strip-shaped portions having a second type of doping that is inverse to the first type of doping. A first sidewall doping of the first type of doping is provided at a first sidewall of the isolation trench and a second sidewall doping of the second type of doping is provided at a second sidewall of the isolation trench. The first strip-shaped portions are in contact with the first sidewall doping and the second strip-shaped portions are in contact with the second sidewall doping.

9 Claims, 2 Drawing Sheets

PRIOR ART

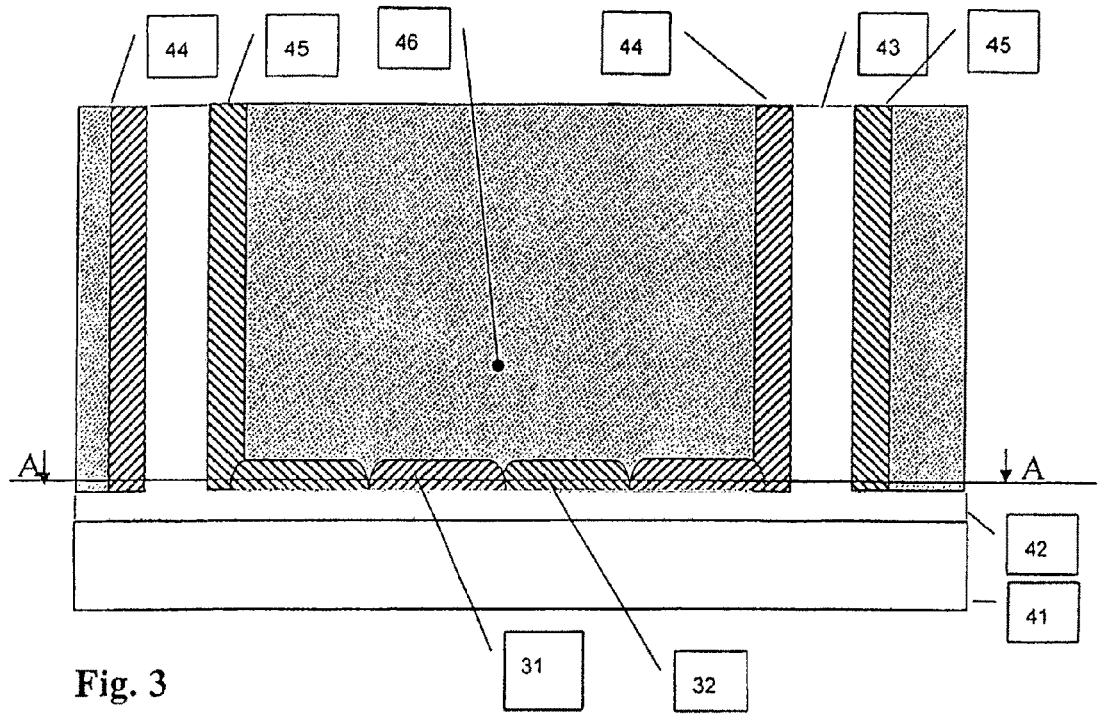
Fig. 3
Fig. 4
view of section AA from Fig. 3
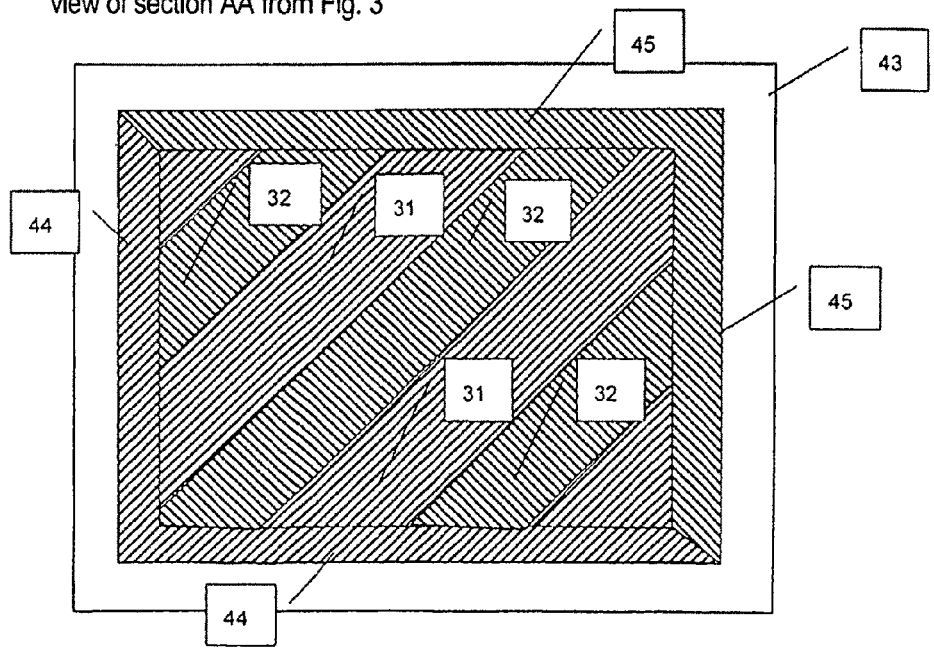

SOI VERTICAL BIPOLAR POWER COMPONENT

BACKGROUND OF THE INVENTION

The invention relates to a vertical SOI device usable for power applications, such as an IGBT (insulated gate bipolar transistor) or power diodes, wherein the SOI device comprises a vertical drift zone and an emitter configuration, which may be implemented by a fabrication methodology according to the SOI (silicon on insulator) technology using isolation trenches.

Due the utilization of positive and negative charge carriers the IGBT provides significant advantages with respect to a reduced on resistance relative to unipolar DMOS transistors in particular at higher voltage ranges, e.g., at 600 Volts. Different from the unipolar vertical NDMOS transistor additional positive charge carriers are typically injected into the device from a specifically design backside. In order to be able to control the concentrations of charge carriers it is, however, necessary to adjust the electrically activated and effective doping profile as a function of the depth of this so-called backside emitter in a very precise manner.

For discrete devices the fabrication of the highly doped backside emitter is performed at the end of the wafer processing. In this way the degree of an undue interaction with the front side processes and in particular with high temperature processes potentially resulting in an undesired diffusion of the backside dopants and hence a change of the doping profile and thus a change in electrical characteristics of the backside emitter may significantly be reduced or avoided.

An integration of such a vertical IGBT into an SOI semiconductor wafer has the consequence that the backside emitter is positioned within the wafer volume. Therefore the backside emitter may no longer be processed at the final stage of the process, since for instance a doping process by ion implantation in the deeper volume of the wafer where the backside emitter is to be formed is associated with severe disadvantages and may thus typically not be applicable. For this reason the backside emitter is frequently incorporated at the initial stage of the process, i.e., prior to the bonding of the device wafer and the carrier wafer to form an SOI substrate. In this case further high temperature steps for forming the devices may have to be taken into consideration, since they may affect the configuration of the backside emitter. Therefore laterally arranged IGBT are frequently integrated into SOI substrates. In the lateral configuration the emitter is no longer positioned in the volume but is located at the front side and may thus be formed by usual doping processes. The lateral configuration of the transistor is disadvantageous in that an increased area is required on the SOI wafer for a transistor having the same resistance compared to a corresponding vertical configuration.

Vertical IGBTs typically have a dopant distribution that is homogenously distributed across the entire backside. However, devices are known in the art, in which the backside emitter is doped in a local varying manner. For example, U.S. Pat. No. 6,259,123 discloses a structure having a backside structure formed from highly n-doped island regions which are positioned within a highly p-doped continuous region.

B. Jayant Baliga, "Power Semiconductor Devices", PWS Publishing Company Boston, 1995, page 180 discloses a diode structure in which also the cathode in the form of a backside doping is alternately provided with $n^+$-type and $p^+$-type conductivity.

These structures are advantageous in that the efficiency of the emitter is more conveniently adjustable by photolithographic techniques, i.e., substantially by the area ratios between the $n^+$ and $p^+$ regions, as is the case by controlling the doping profile. Hence, respective structures are significantly more sensitive to high temperature steps of the actual semiconductor manufacturing process. It is a disadvantage that these emitter structures are not integrated in the SOI substrate, since the $n^+$ and $p^+$ regions in the volume of the SOI substrate are not simultaneously contacted.

BRIEF SUMMARY OF THE INVENTION

It is therefore an object of the present invention to enable a gain in area during the integration of devices and in particular of power devices, such as IGBT devices and diode devices, into circuits based on SOI wafers, i.e., to enable the realization of a vertical drift zone structure allowing the integration into an SOI wafer.

According to the present invention the object is solved by an SOI device comprising an isolation trench that defines a vertical drift zone, wherein the device further comprises a buried insulating layer to which the isolation trenches extends. Moreover, an electrode region emitting charge carriers is provided, which is formed adjacent to the insulating layer and is in contact with the drift zone, wherein the electrode region comprises first strip-like portions having a first type of doping and second strip-like portions having a second type of doping that is inverse to the first type. Furthermore, a first sidewall doping of the first type of doping is provided, which is formed at a first sidewall of the isolation trench and a second sidewall doping of the second type is provided that is formed at a second sidewall of the isolation trench, wherein the first strip-like portions are in contact with the first sidewall doping and the second strip-like portions are in contact with the second sidewall doping.

According to the present invention an SOI device structure is disclosed in which a vertical drift zone having a differently doped buried emitter region is configured such that an integration into the SOI silicon wafer may be realized without undue interactions of the actual semiconductor manufacturing process with the characteristics of the emitter as is discussed above with reference to the two known devices. This may be accomplished by providing the potential for electrically separately contacting the buried emitter structure, i.e., the first and second strip-like portions, through the respective sidewall doping regions from the surface.

In this way valuable integration area on the semiconductor wafer may be saved for SOI devices, wherein in addition to the advantage of a vertical configuration of the drift zone also structural features required for the function of the circuit, that is, the isolation trench, are used for the contacts, and hence in total an efficient SOI structure is provided that is highly compatible with conventional fabrication techniques.

In a further advantageous embodiment the first and second strip-like portions form a continuous region. In this way a further efficient utilization of the semiconductor area may be achieved.

In a further advantageous embodiment the first sidewall and second sidewall are facing each other and are substantially parallel to each other. In this manner at least for the contact producing sidewalls of the isolation trench a shape compatible with conventional isolation trench assemblies may be used.

In a further embodiment two first and two second sidewalls are provided. Hence, a substantially rectangular configuration may be obtained for the buried emitter region, so that existing designs of conventional SOI devices having respective isolation trenches may substantially be used.

In a further embodiment each of the first and second strip-shaped portions is in contact with the first and the second sidewall, respectively. Due to this structure a high degree of utilization of the surface of the buried electrode region may be achieved, since due to the specific doping of the sidewalls even for a concurrent contact by a respective one of both the first and the second portions an appropriate electric connection may be obtained.

In a further embodiment the isolation structure essentially comprises four rectangularly arranged sidewalls and the first and second strip-like portions are located parallel to each other and parallel to a diagonal line of a base area defined by the sidewalls. By this configuration a conventional isolation trench structure may be realized, wherein the respectively diagonally positioned strip-like portions enable an optimal utilization of the available while simultaneously providing electric contact.

In an advantageous embodiment the device represents an IGBT. In a further embodiment the device represents a diode.

BRIEF DESCRIPTION OF THE SEVERAL VIEWS OF THE DRAWINGS

The invention will now be described and completed by means of embodiments including two semiconductor wafers while referring to the drawings.

FIG. 3 is a contact scheme of an emitter located in the interior of an SOI wafer and comprising $n^+$ doped and $p^+$ dopes regions corresponding to FIG. 2, wherein different types of doped regions with respect to the conductivity are provided at oppositely located sidewalls of an isolation trench according to the present invention.

FIG. 4 is a plan view of the buried emitter region having the isolation trench according to the section A-A of FIG. 3.

DETAILED DESCRIPTION OF THE INVENTION

Figure 1:
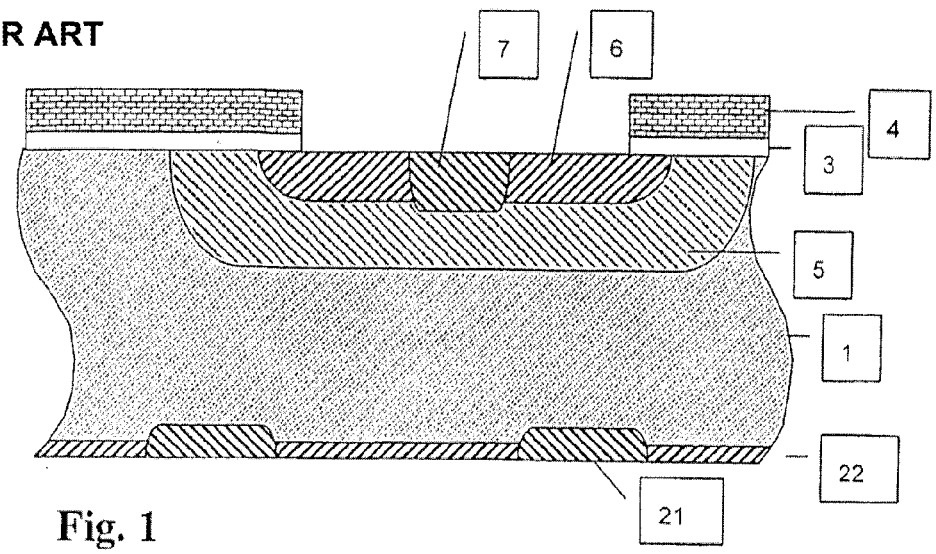
FIG. 1 is a sectional view of a conventional discrete IGBT structure with the backside emitter being formed from n-doped island regions that are located within a highly p-doped regions of greater area.

It is to be appreciated that throughout the figures like or similar components are denoted by the same reference numerals. Furthermore, respective components described with reference to a preceding figure will not be described in a detailed manner again in the following portion of the specification.

FIG. 1 illustrates an IGBT device formed in an Si substrate having a low n-type doping. In the substrate 1, a weakly p-doped well region 5 is provided in which are formed a heavily n-doped source region and a heavily p-doped well contact region. A gate insulation layer 3 is formed above the well region 5 and the substrate 1, followed by a gate electrode 4 comprised of polysilicon. At the backside of the substrate 1 is provided a continuously formed p-doped backside emitter region 21 in which $n^+$-doped island regions 22 are provided.

Figure 2:
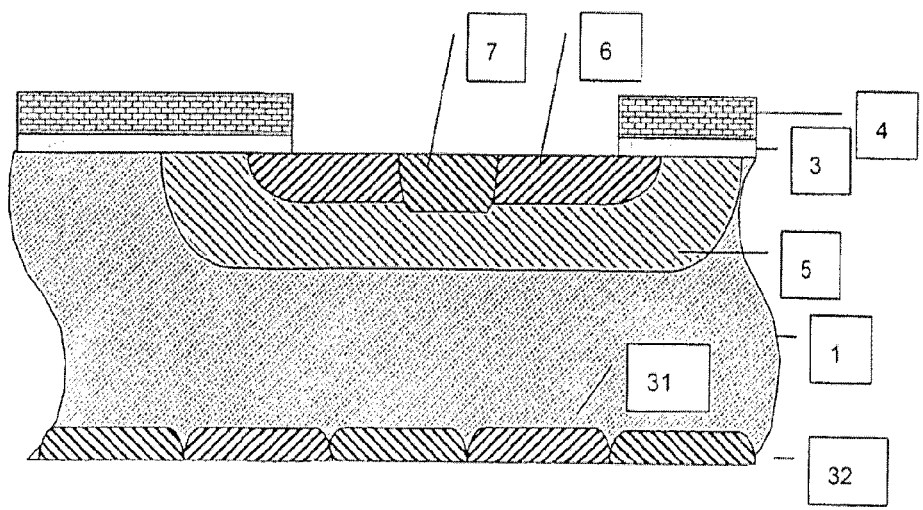
FIG. 2 is an IGBT structure with an emitter divided into regularly alternating highly n-doped and highly p-doped regions.

FIG. 2 depicts an IGBT device also formed in a silicon substrate 1 that may be used for manufacturing SOI substrates according to an embodiment of the present invention, wherein strip-shaped portions 31 and 32 of inverse doping form a respective electrode region at the backside of the substrate 1.

FIG. 3 depicts the structure of an SOI device according to the embodiment of the present invention, wherein an electrode region comprised of strip-shaped portions 31 and 32 is located adjacent to a buried insulating layer 42. The insulating layer 42 is formed above a substrate 41 that may be provided in the form of a silicon substrate and the like. Moreover, the device comprises an isolation trench 43 that defines a vertical drift region 46, which may, for instance, correspond to a weakly doped silicon region within the substrate, such as the silicon substrate of FIGS. 1 and 2. At sidewalls of the isolation trench 43, facing each other and arranged oppositely to each other, respective sidewall dopings or doped regions 44, 45 are formed that differ from each other in the type of doping and thus represent conductivity types that are inverse to each other.

During the integration of a device having a vertical drift zone, such as an IGBT, into an SOI wafer with the emitter structure, i.e., the strip-shaped portions 31 and 32, located in the interior of the wafer, these portions will initially be incorporated into the surface of a first weakly n-doped silicon wafer, as is for instance shown in FIG. 2 when referring to the substrate 1. Thereafter the substrate 41 including the insulating layer 42 formed thereon for instance as an oxide layer may be bonded to the semiconductor wafer 1 bearing the emitter structures 31 and 32. Next, starting from the first silicon wafer 1 the wafer composite is thinned and planarized to obtain the required dimension. Thereafter all further steps may be performed for forming the integrated circuit as are usually provided in an SOI wafer, thereby also including the fabrication of the isolation trenches 43. In this process also the respective structures for forming an IGBT are manufactured as is for example shown in FIGS. 1 and 2, namely the heavily p-doped well region 5, the heavily n-doped source region 6, the heavily p-doped well contact region 7, the gate insulation layer 3 and gate polysilicon 4, as is shown in FIGS. 1 and 2. The electric connection of the $n^+$ and $p^+$ strips 31 and 32 is provided by the differently doped sidewall doping regions 44 and 45 of the isolation trench 43, as is shown in FIG. 3. When the emitter strips 31 and 32 are formed in an appropriate diagonal manner and the isolation trenches are provided with a sidewall doping at both sides of the trenches that is different with respect to the conductivity type, a high degree of area utilization may be achieved, wherein the emitter strips 31 and 32 are electrically contacted via the respective sidewall doping regions 44 and 45 from the surface of the device. In this manner at respective sides the strips 31 and 32 are in contact with respective sidewall doping regions 44 and 45, respectively of the isolation trench 43, that is, with a portion of the same conductivity type.

FIG. 4 illustrates an area optimised design including a substantially rectangular configuration of the isolation trench 43 and a rectangular base area defined by the isolation trench, in which the strip-shaped portions 31 and 32 are disposed substantially parallel with respect to a diagonal of this base area. If the strips 31 and 32 having the same sidewall doping as shown in the figure would be arranged from the upper left to the lower right corner, half of the strips would not be connected.

The SOI device illustrated in FIGS. 2 to 4 and representing an IGBT structure in this embodiment may be implemented into "smart power" circuits of SOI wafers due to the enhanced emitter design. Because of the vertical extension of the drift zone 46 a significantly lower area consumption may be realized for a given on-resistance.

In a further embodiment, a power device is described that can be integrated into SOI wafers, in which a continuous electrode region for charge carrier emission is provided adjacent to a vertical drift zone that is composed of strip-shaped portions of different conductivity type and that is located in the volume of the active semiconductor layer adjacent to the insulating layer of the SOI configuration, wherein these portions have an electric connection to contacts at the surface.

The device is characterized in that the electric connection of the strip-shaped portions that are doped differently with respect to their conductivity type has been formed from the surface of the wafer by respectively differently doped sidewalls of the isolation trench, wherein the electric connection is made such that the two opposing sidewalls of a trench section are doped such that the one side has the opposite conductivity type of the other side and the strip-shaped portions are registered such that each of the portions is at one side in contact with the isolation trench region having the same conductivity type and at the other side is in contact with the regions having the inverse conductivity type.

Advantageously, the device is an IGBT, wherein the strip-shaped portions of the buried emitter are arranged in a diagonal manner with respect to the rectangularly or orthogonally extending isolation trench and are contacted by the sidewall doping regions having the respective borders between each other located along the isolation trench.

In a further embodiment the power device is a diode.

SOME REFERENCE NUMERALS vertical drift region 46, drift zone 46
gate polysilicon 4
insulating layer 3
heavily p-doped well contact region 7
n-doped source region 6
strip-shaped portions 31 and 32
isolation trench 43

I claim:

1. A silicon on insulator device having a surface and comprising:
   an isolation trench defining a vertical drift zone;
   a buried insulating layer to which said isolation trench extends;
   an electrode region for emitting charge carriers, said electrode region being formed adjacent to said insulating layer, being in contact with said drift zone and comprising first strip-shaped portions having a first type of doping and second strip-shaped portions having a second type of doping that is inverse to said first type of doping;
   a first sidewall doping of said first type of doping, said first sidewall doping provided at a first sidewall of said isolation trench; and
   a second sidewall doping of said second type of doping, said second sidewall doping provided at a second sidewall of said isolation trench;
   wherein said first strip-shaped portions are electrically connected to said first sidewall doping and said second strip-shaped portions are electrically connected to said second sidewall doping thereby enabling a separate electrical contact of said first and second strip-shaped portions from said surface of the silicon on insulator device.

2. The device of claim 1, wherein said first and second strip-shaped portions form a continuous electrode region.

3. The device of claim 2, wherein said first and second sidewalls of said isolation trench are arranged in an opposing relationship and said first and second sidewalls extend substantially parallel to each other.

4. The device of claim 1, wherein said device comprises an insulated gate bipolar transistor.

5. The device of claim 1, wherein said device comprises a diode.

6. A silicon on insulator device comprising:
   an isolation trench defining a vertical drift zone;
   a buried insulating layer to which said isolation trench extends;
   an electrode region for emitting charge carriers, said electrode region being formed adjacent to said insulating layer, being in contact with said drift zone and comprising first strip-shaped portions having a first type of doping and second strip-shaped portions having a second type of doping that is inverse to said first type of doping;
   a first sidewall doping of said first type of doping, said first sidewall doping provided at a first sidewall of said isolation trench; and
   a second sidewall doping of said second type of doping, said second sidewall doping provided at a second sidewall of said isolation trench;
   wherein said isolation trench comprises four substantially rectangularly arranged sidewalls to form an inner rectangle and said first and second strip-shaped portions are parallel to each other and within the rectangle.

7. The device of claim 1, wherein said isolation trench is substantially rectangular.

8. The device of claim 7, wherein said first and second strip-shaped portions are aligned in parallel to each other.

9. The device of claim 8, wherein said strip-shaped portions are in a respective extension inclined with respect to all sidewalls.

* * * * *